United States Patent
Fujii et al.

(10) Patent No.: US 8,047,636 B2
(45) Date of Patent: Nov. 1, 2011

(54) FILM DEPOSITING APPARATUS, A FILM DEPOSITING METHOD, A PIEZOELECTRIC FILM, AND A LIQUID EJECTING APPARATUS

(75) Inventors: Takamichi Fujii, Kanagawa (JP); Takayuki Naono, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 301 days.

(21) Appl. No.: 12/461,463

(22) Filed: Aug. 12, 2009

(65) Prior Publication Data

US 2010/0039481 A1 Feb. 18, 2010

(30) Foreign Application Priority Data

Aug. 13, 2008 (JP) .................... 2008-208571

(51) Int. Cl.
*B41J 2/045* (2006.01)
*C23C 14/00* (2006.01)
(52) U.S. Cl. .................... 347/68; 204/298.15
(58) Field of Classification Search .......... 347/68, 347/69, 70–72; 204/192.12, 192.15, 192.18, 204/192.22, 298.12, 298.15, 298.18, 298.22
See application file for complete search history.

(56) References Cited

U.S. PATENT DOCUMENTS

| | | | | |
|---|---|---|---|---|
| 4,721,553 | A | * | 1/1988 | Saito et al. ............. 204/192.12 |
| 7,226,151 | B2 | * | 6/2007 | Murai ........................ 347/71 |
| 7,422,315 | B2 | * | 9/2008 | Hori .......................... 347/71 |
| 2008/0081128 | A1 | | 4/2008 | Fujii |

* cited by examiner

*Primary Examiner* — Kristal Feggins
(74) *Attorney, Agent, or Firm* — Birch, Stewart, Kolasch & Birch, LLP

(57) ABSTRACT

A film depositing apparatus comprises: a process chamber; a target holder provided in the process chamber for holding a target; a substrate holder for supporting a deposition substrate such that the deposition substrate faces the target holder in the process chamber; a power supply for supplying electric power between the target holder and the substrate holder to generate plasma in the process chamber; and an anode provided between the target holder and the substrate holder for capturing ions and/or electrons in the plasma being generated within the process chamber, wherein the anode includes: a cylindrical member provided so as to surround an outer periphery of a side of the substrate holder that faces the target holder; and at least one annular plate member attached to an inside wall of the cylindrical member, the plate member having a central opening larger than a surface of the deposition substrate.

19 Claims, 4 Drawing Sheets

FILM DEPOSITING APPARATUS, A FILM DEPOSITING METHOD, A PIEZOELECTRIC FILM, AND A LIQUID EJECTING APPARATUS

BACKGROUND OF THE INVENTION

The present invention relates to an apparatus and a method for film deposition, a piezoelectric film and a liquid ejecting apparatus. The present invention particularly relates to an apparatus and a method for depositing films by plasma-assisted vapor-phase deposition techniques, as well as a piezoelectric film formed by the film depositing method and a liquid ejecting apparatus that uses such a piezoelectric film.

It is known to deposit a piezoelectric film and other thin films by vapor-phase deposition techniques such as sputtering. In sputtering, plasma ions, such as Ar ions, of high energy that are generated by plasma discharge in high vacuum are allowed to strike a target so that the constituent elements of the target are released and evaporated on a surface of a substrate.

To deposit films of good quality, various deposition conditions must be optimized. Take, for example, the case of depositing piezoelectric films of Pb-containing perovskite type oxides in the class of PZT (lead zirconate titanate); if deposition is performed under high-temperature conditions, a typical problem that occurs is high likelihood for Pb to be lost from the deposited piezoelectric film. Hence, in order to deposit piezoelectric films of Pb-containing perovskite type oxides, efforts have been made to look for deposition conditions under which a perovskite crystal with a smaller amount of the pyrochlore phase will grow satisfactorily and Pb loss less likely to occur. Another consideration is that the quality of piezoelectric films is also affected by the plasma conditions.

Under the circumstances, US 2008/0081128 A1 has disclosed a film depositing apparatus in which a shield is provided above a target holder in such a position that it surrounds the outer periphery of the side of the target holder that faces a deposition base, so that the shield serves to adjust and optimize the difference between the plasma potential and the floating potential within a deposition vessel (chamber).

As a matter of fact, the film depositing apparatus disclosed in US 2008/0081128 A1, which is provided with the shield above a target holder in such a position that it surrounds the outer periphery of the side of the target holder that faces a deposition base, enables the state of potential in the plasma space within the vacuum vessel to be effectively adjusted to optimize the state of plasma; as a further advantage, the shield serves to adjust and optimize the difference between the plasma potential and the floating potential within the chamber, whereby a film of good quality can be deposited.

However, the recent demand in the industry is for further improving the film quality while depositing a film at faster speed.

SUMMARY OF THE INVENTION

An object, therefore, of the present invention is to solve the problems with the above-described prior art by providing a film depositing apparatus with which films of good quality can be formed at a faster speed.

Another object of the present invention is to provide a film depositing method by which films of good quality can be formed at a faster speed.

Yet another object of the present invention is to provide a piezoelectric film as formed by this film depositing method.

Still another object of the present invention is to provide a liquid ejecting apparatus that uses the thus formed piezoelectric film.

A film depositing apparatus according to the present invention comprises: a process chamber; a gas supply source for supplying gases necessary for film deposition into the process chamber; an evacuating means for evacuating an interior of the process chamber; a target holder provided in the process chamber for holding a target; a substrate holder for supporting a deposition substrate such that the deposition substrate faces the target holder in the process chamber; a power supply for supplying electric power between the target holder and the substrate holder to generate plasma in the process chamber; and an anode provided between the target holder and the substrate holder so as to surround an outer periphery of a side of the substrate holder that faces the target holder for capturing ions and/or electrons in the plasma being generated within the process chamber, wherein the anode includes: a cylindrical member provided so as to surround the outer periphery of the side of the substrate holder that faces the target holder; and at least one annular plate member attached to an inside wall of the cylindrical member, the plate member having a central opening larger than a surface of the deposition substrate.

A film depositing method according to the present invention comprises the steps of: placing a target to be held by a target holder in a process chamber; providing a deposition substrate held by a substrate holder so as to face the target holder in the process chamber; generating plasma by supplying electric power between the target holder and the substrate holder while supplying gases necessary for film deposition into the process chamber; and depositing a film of a material of the target onto a surface of the deposition substrate as an anode captures ions and/or electrons generated in the plasma, the anode comprising: a cylindrical member that is provided between the target holder and the substrate holder so as to surround an outer periphery of the surface of the deposition substrate on which a film is deposited; and at least one annular plate member that is attached to an inside wall of the cylindrical member and that has a central opening larger than the deposition substrate.

A piezoelectric film according to the present invention is one formed by such a film depositing method.

A liquid ejecting apparatus according to the present invention comprises: a piezoelectric device including such a piezoelectric film and electrodes provided on both surfaces of the piezoelectric film; a liquid reservoir for storing liquid, the liquid reservoir having a nozzle; and a diaphragm that is provided between the piezoelectric device and the liquid reservoir so as to transmit vibration from the piezoelectric device to the liquid reservoir, wherein the piezoelectric device is applied with a voltage to transmit vibration from the piezoelectric device to the liquid reservoir via the diaphragm, thereby ejecting the liquid in the liquid reservoir through the nozzle.

DETAILED DESCRIPTION OF THE INVENTION

On the following pages, the film deposition apparatus and method of the present invention are described in detail with reference to the preferred embodiments shown in the accompanying drawings.

Embodiment 1

Figure 1:
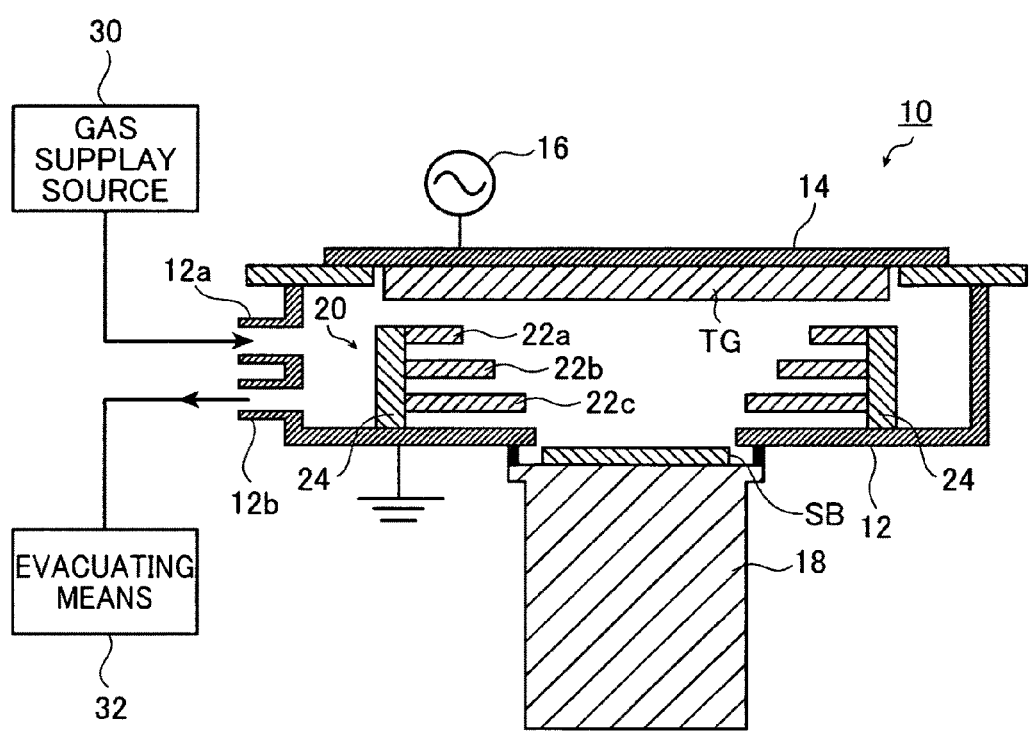
FIG. 1 is a sectional view showing in concept the structure of a film depositing apparatus according to Embodiment 1 of the present invention.

FIG. 1 shows the structure of a film depositing apparatus generally indicated at 10 according to Embodiment 1 of the present invention.

On the following pages, a film depositing apparatus that deposits a piezoelectric film as a thin layer and which produces a piezoelectric device as a thin-film device that uses the thin layer is described as a typical example but it should be noted that the present invention is by no means limited to this particular case and that it is also applicable in film depositing apparatuses that produce other types of thin-film devices.

As shown in FIG. 1, the film depositing apparatus 10 has a vacuum vessel (process chamber) 12 which has a target holder 14 placed on its ceiling portion. The target holder 14 not only holds a sputter target material TG but also functions as a cathode for generating a plasma within the vacuum vessel 12. The target holder 14 is connected to a RF power supply 16. Beneath the area of the vacuum vessel 12 in a face-to-face relation with the target holder 14, there is provided a platform (substrate holder) 18 for supporting a substrate SB on which a thin layer is to be formed from the constituents of the target material TG and an anode 20 for capturing ions and/or electrons in the plasma being generated within the vacuum vessel 12 is provided between the target holder 14 and the platform 18.

The vacuum vessel 12 is a highly airtight vessel that is formed of iron, stainless steel, aluminum or any other materials that can maintain a predetermined degree of vacuum required for sputtering; the vacuum vessel 12 is electrically grounded and equipped with a gas supply pipe 12a for supplying the vacuum vessel 12 with the gases necessary for film deposition and a gas exhaust pipe 12b for discharging the gases from the interior of the vacuum vessel 12.

The vacuum vessel 12 may be of various types including a vacuum chamber, a bell jar, and a vacuum tank that are employed in the sputter apparatus.

Gases to be introduced into the vacuum vessel 12 through the gas supply pipe 12a may include argon (Ar), as well as a mixture of argon (Ar) and oxygen ($O_2$).

The gas supply pipe 12a is connected to a gas supply source 30.

The gas exhaust pipe 12b is connected to an evacuating means 32 such as a vacuum pump for discharging gases out of the vacuum vessel 12 so that a predetermined degree of vacuum is created therein and maintained during film deposition.

The target holder 14 is a cathode electrode and connected to the RF power supply 16. It should also be noted that in the interior of the vacuum vessel 12, the target holder 14 is insulated from any other components. The target holder 14, being provided in the upper part of the interior of the vacuum vessel 12, can hold on its surface the target material TG which is determined by the composition of a thin layer such as a piezoelectric film to be deposited.

The RF power supply 16 is for supplying the target holder 14 with a sufficient amount of RF power (negative RF waves) to form a plasma of Ar and other gases that have been introduced into the vacuum vessel 12; one end of the RF power supply 16 is connected to the target holder 14 while the other end, although not shown, is electrically grounded.

Note that the RF power to be fed to the target holder 14 by the RF power supply 16 is not particularly limited and may be exemplified by RF power of 13.65 MHz with a maximum output of 5 kW or 1 kW. The target holder 14 may also be supplied with RF power having a RF output of 1 kW to 10 kW at an oscillating frequency of 50 kHz to 2 MHz, 27.12 MHz, 40.68 MHz, or 60 MHz.

The target holder 14, when supplied with RF power (negative RF waves) from the RF power supply 16, undergoes an electric discharge to form a plasma of Ar and other gases that have been introduced into the vacuum vessel 12, whereupon Ar ions and other positive ions (plasma ions) are generated. Hence, the target holder 14 may also be called a plasma electrode.

The thus generated positive ions sputter the target material TG held on the target holder 14. The constituent elements, or sputter particles, in the target material TG thus sputtered by the positive ions are released from the target material TG and deposited, in either a neutral or ionized state, on the substrate SB placed in a face-to-face relation with the target material TG.

This is how a plasma space containing positive ions such as Ar ions and the constituent elements released from the target material TG is formed between the target holder 14 and the substrate SB held on the platform 18.

The platform 18 is for supporting the bottom of the substrate SB so that it is held within the vacuum vessel 12 at a position in a face-to-face relation with the target holder 14.

The platform 18 is equipped with a heater (not shown) for heating the substrate SB to a predetermined temperature and maintaining it during film deposition on the substrate SB.

The size of the substrate SB to be mounted on the platform 18 is not particularly limited and it may be a circular substrate with a diameter of 6, 5 or 8 inches or a square substrate 5 cm on all sides.

Note that the substrate SB is electrically insulated from the vacuum vessel 12 and the platform 18 and that the substrate SB is supplied with a predetermined voltage.

The anode 20 comprises a cylindrical member 24 which is provided on the bottom surface of the vacuum vessel 12 and three plate members 22a to 22c each in a circular-ring shape and formed integrally with the inside wall of the cylindrical member 24. The plate members 22a to 22c are arranged such that they are spaced apart from one another in the direction perpendicular to the surface of the platform 18, while their central openings are superposed coaxially. In addition, the central openings of the plate members 22a to 22c are respectively larger than the substrate SB, and the plate members 22a to 22c are provided so as to surround the outer periphery of the side of the platform 18 (substrate SB) that faces the target holder 14.

Note that the anode 20 is electrically grounded.

The plate members 22a to 22c all have the same outside diameter since they are attached to the inside wall of the cylindrical member 24; their inside diameters only differ from each other such that the plate member that is closer to the plate member 18 has the smaller inside diameter. Thus, the inside diameter of the plate member 22c is smaller than the inside diameter of the plate member 22b which in turn has a smaller inside diameter than that of the plate member 22a.

The distance by which the plate members 22a to 22c in the anode 20 are spaced from one another is preferably at least 1.0 mm such that sufficient numbers of electrons will enter the individual gaps that they will serve adequately as the anode; it is also preferred that in order to ensure that sputter particles will not enter the gaps so easily as to foul the anode, the distance is not more than 15.0 mm.

It should be noted that the distance by which the plate members 22a to 22c in the anode 20 are spaced concerns a pair of plate members 22 adjacent to each other in a vertical direction and means the distance between the bottom surface of the plate member in the upper position and the top surface of the plate member in the lower position. To be more specific, the distance of interest refers to the distance between the bottom surface of the plate member 22a and the top surface of the plate member 22b, as well as the distance between the bottom surface of the plate member 22b and the top surface of the plate member 22c.

We will now describe detailed reasons why the anode 20 which is structurally so designed as to capture the ions and/or electrons in the plasma being generated within the vacuum vessel 12 is provided between the target holder 14 and the platform 18.

A conventional film depositing apparatus, particularly, a RF (radio-frequency) sputtering apparatus, of the structural design described above has involved a problem in that during the process of film deposition while crystals (in thin layer) are growing on the substrate, positive ions such as Ar ions impinge against a surface of the substrate with a specified amount of energy, whereby the thin film formed on the substrate is sputtered (back sputtered).

The present inventors made a study on this problem and found that when the substrate was installed in that part of the vacuum vessel where the plasma density was high (i.e., the part closer to the region of plasma generation), the sputter particles generated by the sputtering of the target arrived at the substrate with higher probability but, at the same time, back sputtering also occurred actively, with the result that the deposition rate dropped considerably.

To deal with this problem, the present inventors made an attempt at increasing the distance between the target and the substrate but then the probability with which the sputter particles would arrive at the substrate dropped, making it difficult to achieve an effective improvement in the deposition rate.

The present inventors further found the following: the more active the back sputtering was, the more adversely the deposited thin layer was affected in terms of crystallinity, and particularly in the case of sputtering a multi-component material such as PZT (lead zirconate titanate), atoms with higher sputter rate (sputter rate is defined as the ratio of the number of atoms in the target sputtered by positive ions to the number of positive ions incident on the target) were preferentially back sputtered and less likely to be deposited on the substrate base, eventually lowering the quality of the thin layer being deposited.

Under the circumstances, the present inventors speculated that if the probability with which the sputter particles would arrive at the substrate could be improved while suppressing the occurrence of back sputtering, it might be possible to realize marked improvements in the deposition rate and quality of the thin layer being deposited.

Based on this speculation, the present inventors thought of providing an anode so as to surround the outer periphery of a surface of the platform so that the deposition rate and quality of the thin layer being deposited could be improved while suppressing the arcing that would otherwise occur within the vacuum vessel.

In addition, the inventors of the present invention found that particles (foreign objects) falling on a surface of the target could cause abnormal discharge, or particles falling on the substrate surface could generate defects such as pin holes on the thin layer being deposited. Accordingly, the present inventors have arrived at the concept of closing the gaps formed by the plate members 22a to 22c, which are spaced apart from one another, at their outside diameters with the cylindrical member 24 in order to prevent particles from entering the gaps from the outside diameters of the plate members 22a to 22c toward their inside diameters.

In this way, the present invention suppresses back sputtering without changing the plasma potential, with the result that the deposition rate and quality of the thin layer being deposited can be improved.

In addition, abnormal discharge and defects on the thin layer being deposited can be prevented by suppressing particles from entering from the outside diameter side of the anode 20. In this way, quality of the thin layer to be deposited in this embodiment can be improved.

In particular, in the embodiment under consideration, the anode 20 is designed to include a plurality of plate members 22a to 22c, so the possibility for the state of plasma to change by decreasing of the effective area of the anode due to the formation of an unnecessary film thereon with plasma ions can be sufficiently suppressed to ensure that thin layers of good quality can consistently be formed.

As an additional feature, the anode 20 is so constructed that the inside diameter of the lower plate member which is the closer to the platform 18 is smaller than that of the overlying plate member, namely, it decreases in the order of the plate members 22c, 22b and 22a. As a result, sputter particles are more likely to deposit only on the substrate SB, enabling deposition of a film having good quality.

Note that in the embodiment under consideration, the anode 20 comprises the cylindrical member 24 and plate members 22a to 22c of annular-ring shape, but this is not the sole case and the cylindrical member 24 may be quadrangular cylinder, oval cylinder, or other cylinder as long as the cylindrical member 24 is shaped to substantially surround the outer periphery of the surface of the platform 18. In addition, the plate members 22a to 22c are by no means limited to this configuration (annular shape) as long as they have larger central openings than the substrate SB, are spaced apart from one another, and can be attached to the inside wall of the cylindrical member.

In the embodiment under consideration, the anode 20 is constituted by providing three plate members 22a to 22c to the inside wall of the cylindrical member 24, but the present invention can adopt any other configuration as long as the anode 20 is constituted by providing one or more plate members to the inside wall of the cylindrical member 24.

Moreover, in the embodiment under consideration, the anode 20 is designed such that the plate member which is located closer to the substrate SB has a shorter shortest distance from the center of the central opening to the inner surface (inside diameter), but the present invention is not limited to this and allows the anode 20 to comprise two or more plate members that are all in a same shape.

It should be noted here that the shortest distance from the center of a central opening of a particular plate member to its inner surface means the inside diameter when the plate member is an circular-ring shape, and when it is a rectangular hollow enclosure, the distance from the center of the rectangle to the center of its longer side is the shortest distance of interest.

On the following pages, the method of film deposition using the film depositing apparatus 10 is described.

First, the sputter target material TG is held on the target holder 14 installed within the vacuum vessel 12 and the substrate SB is then held on the platform 18.

In the present invention, the material of the target material TG is not particularly limited and an insulator, a piezoelectric material, a dielectric material or a ferroelectric material is preferred, with a Pb-containing dielectric material being particularly preferred.

In the next step, the interior of the vacuum vessel 12 is evacuated through the gas exhaust pipe 12b by the evacuating means 32 until a predetermined degree of vacuum is created within the vacuum vessel 12. When the predetermined degree of vacuum is created within the vacuum vessel 12, plasma forming gases such as argon gas (Ar) are supplied at predetermined flow rates into the vacuum vessel 12 from the gas supply source 30 through the gas supply pipe 12a. Note that gases are kept discharged out of the vacuum vessel 12 through the gas exhaust pipe 12b in order to maintain the predetermined degree of vacuum within the vacuum vessel 12. At the same time, the target holder 14 is supplied with RF power (negative RF power) from the RF power supply 16 to cause an electric discharge from the target holder 14. As a result, the plasma forming gases introduced into the vacuum vessel 12 form a plasma to generate plasma ions such as Ar ions, whereupon a plasma space is established between the target holder 14 and the substrate SB.

The positive ions within the thus formed plasma space sputter the target material TG held on the target holder 14 and the constituent elements in the sputtered target material TG are released from it and deposited, either in a neutral or ionized state, on the substrate SB held on the platform 18. This is how the process of film deposition starts.

During the deposition of a thin layer, the anode adjusts (controls) and optimizes the deposition rate.

The anode 20 can improve the deposition rate by suppressing the occurrence of back sputtering during film deposition.

Thus, one can obtain an insulator film, a piezoelectric film, a dielectric film or a ferroelectric film that involves no variations in quality and composition. Among these films, the piezoelectric film that can be obtained is of such high quality that perovskite crystals comprising a Pb-containing perovskite-type oxide such as PZT with less content of the pyrochlore phase grow in a consistent manner and that Pb loss is effectively suppressed. This piezoelectric film can be utilized in a piezoelectric device that is typically used in ink-jet heads.

A preferred piezoelectric film is such that its surface roughness indicating its denseness is less than 100 Å above the surface roughness of the substrate SB for the piezoelectric film, more preferably less than 50 Å above the surface roughness of the substrate SB for the piezoelectric film.

Embodiment 2

Figure 2:
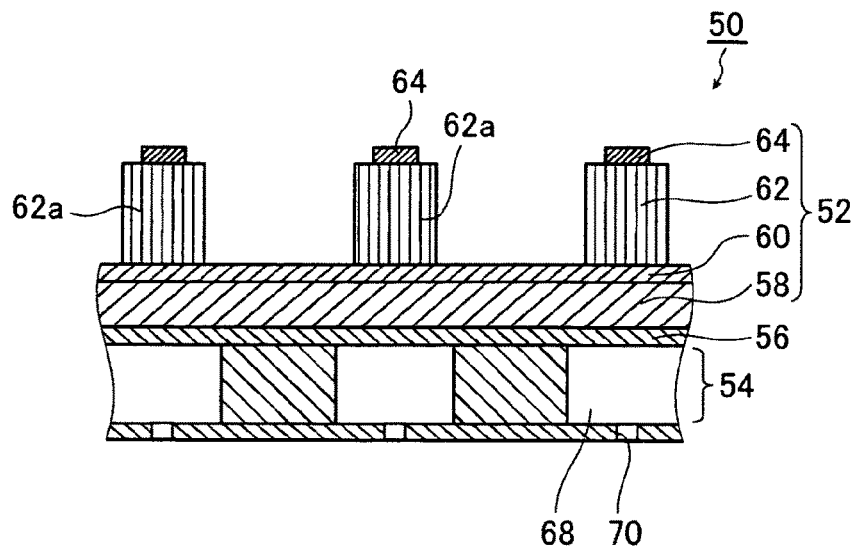
FIG. 2 is a sectional view showing the structure of an ink-jet head according to Embodiment 2 of the present invention.

FIG. 2 is a sectional view showing the essential parts of an ink-jet head (liquid ejecting apparatus) generally indicated by 50 according to Embodiment 2 of the present invention, with the section being taken across the thickness of the piezoelectric device. For clarity purposes, the individual components are not scaled to the actual model but are altered as appropriate.

The ink-jet head 50 comprises a piezoelectric device 52 having the piezoelectric film of the present invention, an ink storing/ejecting member 54, a diaphragm 56 provided between the piezoelectric device 52 and the ink storing/ejecting member 54, and nozzles (liquid ejecting ports) 70.

The piezoelectric device 52 comprises a substrate 58 on which a lower electrode 60, a piezoelectric film 62 and upper electrodes 64 are superposed in that order; they are so designed that the lower electrode 60 and each of the upper electrode 64 together apply an electric field to the piezoelectric film 62 across its thickness.

The material of the substrate 58 is not particularly limited and silicon, glass, stainless steel (SUBS), yttrium-stabilized zirconia (YZ), alumina, sapphire, silicon carbide and the like may be used. The substrate 58 may be of a laminated type such as a SiO substrate having a $SiO_2$ oxide layer formed on a surface of a silicon substrate.

The lower electrode 60 is substantially formed on the entire surface of the substrate 58 and the piezoelectric film 62 is formed on top of the lower electrode 60 as a plurality of linear projections 62a that are arranged in a pattern at given spacings. In other words, the piezoelectric film 62 consists of stripes of linear projection 62a that extend in a direction normal to the paper of FIG. 2. Each of the upper electrodes 64 is formed on top of the corresponding projection 64.

The pattern of the piezoelectric film 62 is not limited to the illustrated case and may be designed as appropriate. The piezoelectric film 62 may be a single continuous layer but dividing the piezoelectric film 62 into a plurality of discrete projections is preferred because by doing so, the individual projections 62a will expand or contract smoothly enough to ensure that the piezoelectric film 62 will expand or contract in larger amounts.

The primary component of the lower electrode 60 is not particularly limited and may be exemplified by metals such as Au, Pt. And Air, metal oxides such as $IRON_2$, $RuO_2$, $LaNiO_3$ and $SrRuO_3$, and combinations thereof.

The primary component of the upper electrode 64 is not particularly limited, either, and may be exemplified by the materials enumerated for the lower electrode 60, the electrode materials such as Al, Ta, Cr and Cu that are commonly used in semiconductor processes, and combinations thereof.

The piezoelectric film 62 is a layer that has been deposited by the film deposition method, as described above, of the present invention. The piezoelectric film 62 is preferably one that is made of a perovskite-type oxide.

The lower electrode 60 and the upper electrodes 64 typically have a thickness of about 200 nm. The thickness of the piezoelectric film 62 is not particularly limited and is usually at least 1 μm, typically 1-5 μm.

The ink storing/ejecting member 54 arranged under the substrate 58 of the piezoelectric device 52 via the diaphragm 56 comprises ink chambers (ink reservoirs) 68 for storing ink and ink ejection ports (nozzles) 70 through which ink is ejected from the ink chambers 68 to the outside. The number of ink chambers 68 corresponds to the number and pattern of the projections 62a that compose the piezoelectric film 62. Thus, the ink-jet head 50 has a plurality of ink storing/ejecting members 54 and the projection 62a, the upper electrode 64, the ink chamber 68 and the ink nozzle 70 are provided for each ink storing/ejecting member 54. In contrast, the lower electrode 64, the substrate 58 and the diaphragm 56 are shared by the plurality of ink storing/ejecting members 54; however, this is not the sole case of the present invention and they may be provided for each ink storing/ejecting member 54 or for the ink storing/ejecting members 54 divided into several groups.

In the ink-jet head 50, the strength of an electric field being applied to the projections 62a of the piezoelectric device 52 is increased or decreased for each projection 62a by a conventionally known drive method to expand or contract the projection 62a, whereupon the timing or amount of ink ejection from the corresponding ink chamber 68 is controlled.

While the film depositing method and apparatus according to the present invention, as well as an ink-jet head (liquid ejecting apparatus) having the piezoelectric film of the present invention as deposited by the method and apparatus have been described above in detail with reference to various embodiments, it should be noted that the present invention is by no means limited to those embodiments and various improvements or design modifications are of course possible without departing from the scope and spirit of the present invention.

On the following pages, the present invention will be described in greater detail by referring to specific examples plus the accompanying drawings. Needless to say, the present invention is by no means limited to the following examples.

Example 1

As the film depositing apparatus 10 shown in FIG. 1, used was an apparatus of a commercial type (Model CLN 2000 of Oerlikon).

The target material TG was a sintered disk of 300 mm diameter with the composition of $Pb_{1.3}(Zr_{0.52}Ti_{0.48})O_3$.

The substrate SB had a size of 6 inch diameter and consisted of a Si wafer with an Ir coat formed preliminarily in a thickness of 150 nm.

The distance between the target material TG and the substrate SB was set at 50 mm.

Anode 20 was placed over the substrate SB in such a way that it surrounded the outer periphery of the side of the substrate SB facing the target material TG; the anode consisted of three stainless steel (SUBS) plate members 22a, 22b and 22c; the plate member 22a was the closest to the target material TG and had an outside diameter of 300 mm and an inside diameter of 260 mm; the plate member 22b was beneath the plate member 22a as seen in FIG. 1 and had an outside diameter of 300 mm and an inside diameter of 220 mm; the plate member 22c was the closest to the substrate SB and had an outside diameter of 300 mm and an inside diameter of 180 mm.

With the substrate temperature held at 500° C., a gaseous mixture of Ar and $O_2$ (2.5%) was introduced into the vacuum vessel 12 and at an internal pressure of 0.5 Pa, a power of 3 kW was applied from the RF power supply 16 to perform three runs of PZT (lead zirconate titanate) film deposition.

Determination from the thicknesses of the thus obtained films showed that the deposition rate was about 2500 nm/hr for each run.

Using the thus obtained films, open-pool structures with a 1.1 mm opening in the top were fabricated and driven at a voltage of 30 V to measure the amounts of displacement; the piezoelectricity constant of each film was determined from the displacement data. The result is shown in Table 1.

The films were also measured for their surface roughness by means of DEKTAK 6M of Veeco. The films obtained by three runs of deposition had an average surface roughness of about 25 Å.

The numbers of particles in a size of 5 $\mu m^2$ or larger attached to the thus-obtained films were measured by means of a defect/foreign object detector by KLA Tencor Corporation, and the average number of particles in a size of 5 $\mu m^2$ or larger attached to the films was 21. The result is shown in Table 2.

Example 2

The procedure of Example 1 was repeated to perform three runs of film deposition, except that the distance between the target material TG and the substrate SB was changed to 80 mm.

The deposition rate was about 3500 nm/hr in each run. Further, the piezoelectricity constants of the obtained films were determined as in Example 1 and the result is also shown in Table 1.

Figure 3:
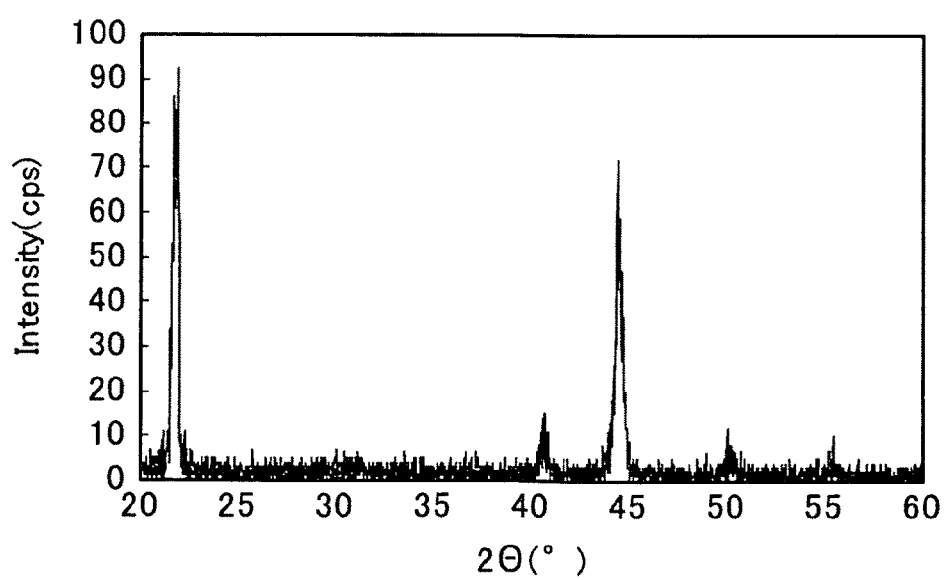
FIG. 3 is a graph showing an XRD pattern from the piezoelectric film prepared in Example 2.

In addition, the obtained films were subjected to X-ray diffraction (XRD) with an X-ray diffractometer (X'spertPRO of PANalytical). An XRD pattern of a typical film specimen is shown in FIG. 3.

Figure 4A:
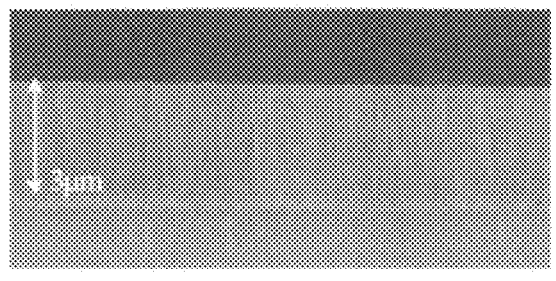
FIGS. 4A and 4B are scanning electron micrographs showing a surface and a section of the piezoelectric film prepared in Example 2, respectively.
Figure 4B:
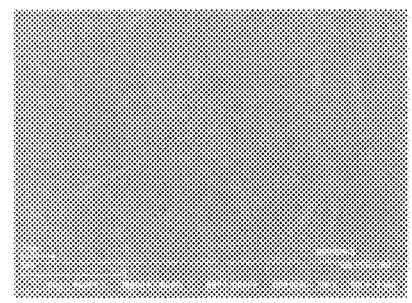

Further in addition, surfaces and cross sections of the obtained films were imaged with a scanning electron microscope (SEM) of Hitachi, Ltd. A scanning electron micrograph of a typical film specimen is shown in FIG. 4A, and a scanning electron micrograph of its cross section is shown in FIG. 4B.

In addition, the proportion of A sites in the obtained films was measured by X-ray fluorescence spectrometry with ZSXPrimus (X-ray fluorescence spectrometer of Rigaku Corporation), and it was 1.11.

The numbers of particles in a size of 5 $\mu m^2$ or larger attached to the thus-obtained films were measured as in Example 1, and the average number of particles in a size of 5 $\mu m^2$ or larger attached to the films was 18. The result is shown in Table 2.

The films were also measured for their surface roughness by means of DEKTAK 6M of Veeco. The films obtained by three runs of deposition had an average surface roughness of about 27 Å.

Example 3

The procedure of Example 1 was repeated to perform three runs of film deposition, except that the distance between the target material TG and the substrate SB was changed to 110 mm.

The deposition rate was about 2500 nm/hr in each run. Further, the piezoelectricity constants of the obtained films were determined as in Example 1 and the result is also shown in Table 1.

The numbers of particles in a size of 5 $\mu m^2$ or larger attached to the thus-obtained films were measured as in Example 1, and the average number of particles in a size of 5 $\mu m^2$ or larger attached to the films obtained by the three runs of deposition was 19. The result is shown in Table 2.

The thus-obtained films were measured for their surface roughness by means of DEKTAK 6M of Veeco. The films obtained by three runs of deposition had an average surface roughness of about 26 Å.

Comparative Example 1

The procedure of Example 1 was repeated to perform three runs of film deposition, except that anode 20 was omitted.

The deposition rate was about 500 nm/hr in each run. Further, the piezoelectricity constants of the obtained films were determined as in Example 1 and the result is also shown in Table 1.

The films were also measured for their surface roughness as in Example 1. The films obtained by three runs of deposition had an average surface roughness of about 155 Å.

The numbers of particles in a size of 5 $\mu m^2$ or larger attached to the thus-obtained films were measured as in Example 1, and the average number of particles in a size of 5 $\mu m^2$ or larger attached to the films obtained by the three runs of deposition was 381. The result is shown in Table 2.

Comparative Example 2

The procedure of Example 2 was repeated to perform three runs of film deposition, except that anode 20 was omitted.

The deposition rate was about 1400 nm/hr in each run. Further, the piezoelectricity constants of the obtained films were determined as in Example 1 and the result is also shown in Table 1.

Figure 5:
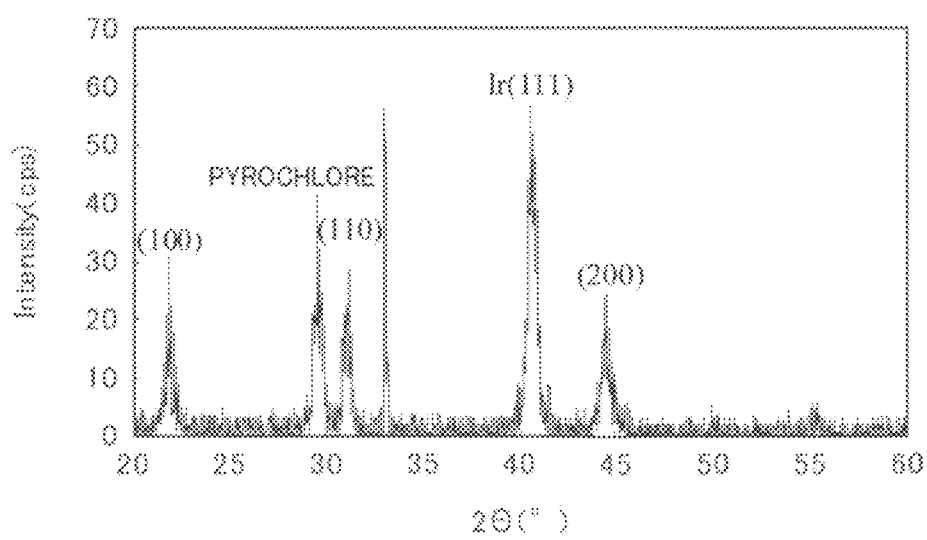
FIG. 5 is a graph showing an XRD pattern from the piezoelectric film prepared in Comparative Example 2.

In addition, the obtained films were subjected to X-diffraction (XRD) as in Example 2. An XRD pattern of a typical film specimen is shown in FIG. 5.

Figure 6A:
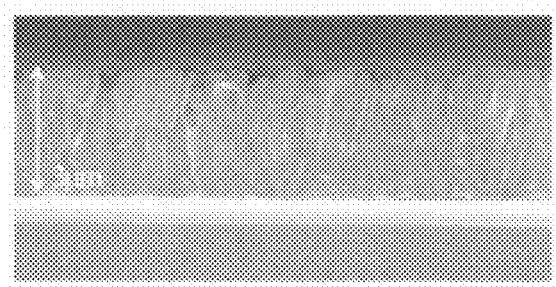
FIGS. 6A and 6B are scanning electron micrographs showing a surface and a section of the piezoelectric film prepared in Comparative Example 2, respectively.
Figure 6B:
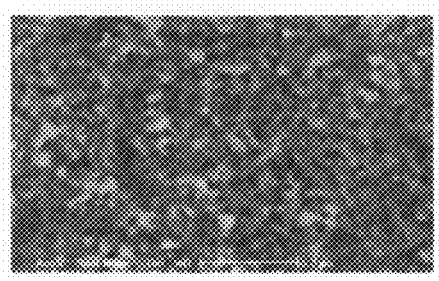

Further in addition, surfaces and cross sections of the obtained films were imaged as in Example 2. A scanning electron micrograph of a typical film specimen is shown in FIG. 6A, and a scanning electron micrograph of its cross section is shown in FIG. 6B.

In addition, the proportion of A sites of Pb in the obtained films was measured by X-ray fluorescence spectrometry and it was 0.90.

The numbers of particles in a size of 5 $\mu m^2$ or larger attached to the thus-obtained films were measured as in Example 1, and the average number of particles in a size of 5 $\mu m^2$ or larger attached to the films obtained by the three runs of deposition was 251. The result is shown in Table 2.

The films were also measured for their surface roughness as in Example 1. The films obtained by three runs of deposition had an average surface roughness of about 170 Å.

Comparative Example 3

The procedure of Example 3 was repeated to perform three runs of film deposition, except that anode 20 was omitted.

The deposition rate was about 600 nm/hr in each run. Further, the piezoelectricity constants of the obtained films were determined as in Example 1 and the result is also shown in Table 1.

The numbers of particles in a size of 5 $\mu m^2$ or larger attached to the thus-obtained films were measured as in Example 1, and the average number of particles in a size of 5 $\mu m^2$ or larger attached to the films obtained by the three runs of deposition was 321. The result is shown in Table 2.

The films were also measured for their surface roughness as in Example 1. The films obtained by three runs of deposition had an average surface roughness of about 210 Å.

TABLE 1

|  | Piezoelectricity Constant (pm/V) |
|---|---|
| Example 1 | 240 |
| Example 2 | 250 |
| Example 3 | 245 |
| Comparative Example 1 | Measurement impossible because the film peeled |
| Comparative Example 2 | 50 |
| Comparative Example 3 | 40 |

TABLE 2

|  | Number of Particles |
|---|---|
| Example 1 | 21 |
| Example 2 | 18 |
| Example 3 | 19 |
| Comparative Example 1 | 381 |
| Comparative Example 2 | 251 |
| Comparative Example 3 | 321 |

Figure 7:
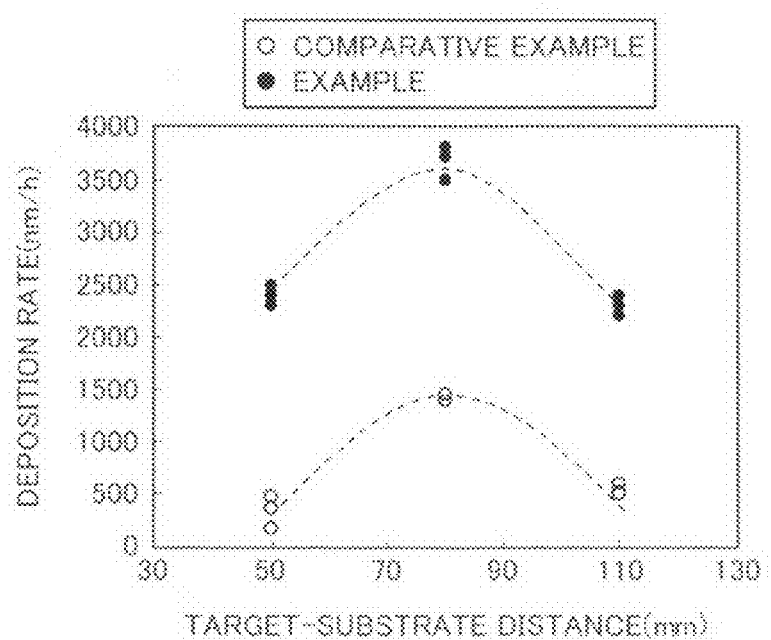
FIG. 7 is a graph showing the deposition rates for the piezoelectric films prepared in Examples 1 to 3 and in Comparative Examples 1 to 3.

FIG. 7 shows how the distance between the target material TG and the substrate board SB related to the deposition rate in Examples 1 to 3 and Comparative Examples 1 to 3. The results of Examples 1 to 3 are represented by solid circles (●) whereas the results of Comparative Examples 1 to 3 are represented by open circles (○).

As can be seen from the results shown in FIG. 7, when film deposition was performed with the apparatus of the present invention (Examples 1 to 3), the deposition rate was 2.6 to 5.0 times the values in Comparative Examples 1 to 3 where anode 20 was omitted and the deposition rate was in the range of 100 nm to 1500 nm.

As shown in FIG. 3, the films obtained in Example 2 were oriented in the (100) direction of the perovskite structure and, as shown in FIGS. 4A and 4B, they had a dense columnar structure that extended from the substrate SB in a vertical direction. On the other hand, as shown in FIG. 5, the films obtained in Comparative Example 2 had a polycrystalline orientation comprising a mixture of the (100) and (110) directions, and as shown in FIGS. 6A and 6B, they were rough on a surface and in cross section. Thus, loss of film denseness considerably increased the possibility for cracking to occur during and after film deposition.

In addition, the proportion of A sites of Pb in the films of Example 2 was 1.11 whereas that in the films of Comparative Example 2 was 0.90; thus, it was found that in the films of Comparative Example 2, Pb with higher sputter rate was preferentially re-evaporated on account of the Ar ion damage (back sputtering) during deposition.

Further in addition, it is clear from the data shown in Table 1 that the films obtained in Examples 1 to 3 possess the desired characteristics as piezoelectric films since a piezoelectricity constant of at least 170 pm/V is typically sufficient to provide the desired piezoelectric effect.

In contrast, the films obtained in Comparative Examples 1 to 3 had lower piezoelectricity constants than the typical value and hence failed to possess the desired characteristics as piezoelectric films. Since the films obtained in Comparative Examples 1 to 3 were rough both on surface and in cross section as shown in FIGS. 6A and 6B, the crystal was probably prevented from being oriented in a single direction, which eventually led to lower piezoelectric characteristics.

As shown in Table 2, the numbers of particles attached to the films obtained in Examples 1 to 3 were all less than 25. Generally, even if particles in a size of 5 $\mu m^2$ or larger are attached to a film, the particles would not adversely affect the production processes unless the number thereof exceeds 50. Hence, the films obtained in Examples 1 to 3 have good film quality enough to be used in products.

On the contrary, the numbers of particles attached to the films obtained in Comparative Examples 1 to 3 all exceeded 250; they do not have good quality enough to be used in products.

The foregoing results are further discussed below. First, as depicted in FIG. 7, whether film deposition was performed with the apparatus not using anode 20 (as in Comparative Examples 1 to 3) or with the apparatus using anode 20 (Examples 1 to 3), the deposition rate peaked when the distance between the target material TG and the substrate SB was 80 mm but it decreased as the distance departed from that value. The reason would be as follows: when the distance between the target material TG and the substrate SB was smaller than 80 mm, sputter particles would arrive at the substrate SB with higher-probability but since the substrate SB was located in the area of higher plasma density, back sputtering by positive ions became so intense as to lower the deposition rate. Conversely, when the distance at issue was greater than 80 mm, the substrate SB was located in the area of lower plasma density, so back sputtering during deposition could be suppressed but, on the other hand, the probability with which sputter particles would arrive at the substrate SB decreased to thereby lower the deposition rate.

Although the change in deposition rate with the distance between the target material TG and the substrate SB showed the same tendency in Examples 1 to 3 and in Comparative Examples 1 to 3, the former case (i.e., depositing films with the apparatus using anode 20) realized deposition rates that were 2.6 to 5.0 times the values in the latter case (i.e., depositing films with the apparatus not using anode 20), as already mentioned before.

This would be explained as follows: compared to the substrate SB set at the floating potential, the anode set to the ground potential had low potential in plasma, so positive ions due to back sputtering would arrive at the anode with higher probability than at the substrate SB, thereby suppressing the back sputtering during deposition.

In addition, it can be speculated from FIGS. 6A and 6B that in Comparative Examples 1 to 3, back sputtering occurred so actively during deposition that the morphology of the resulting films deteriorated.

Thus, the results of Examples 1 to 3 and Comparative Examples 1 to 3 evidenced that by providing the anode 20 in which the plate members 22*a* to 22*c* are integrally attached to the inside wall of the cylindrical member 24 such that the plate members are spaced apart from one another in the directiion perpendicular to the surface of the platform 18 and that their central openings are superposed on another so as to surround the outer periphery of the side of the platfom 18 that faces the target holder 14, positive ions such as argon ions reach the substrate SB to suppress occurrence of back sputtering, resulting in improvement of the deposition rate. Furthermore, the thus-obtained films have small numbers of particles attached thereto, good film quality, and excelent piezoelectric property.

And, the thus-obtained piezoelectric films had a surface roughness less than 50 Å above the surface roughness of the wafer surface (a silicon wafer on which iridium is layered) on which the piezoelectric film was formed, indicating that a piezoelectric film which would not adversely affect the subsequent processes can be produced.

While the film depositing apparatus and method, as well as the piezoelectric film and liquid ejecting apparatus of the present invention have been described above in detail, it should be noted that the present invention is by no means limited to the foregoing embodiments and various improvements and modifications can be made without departing from the spirit and scope of the present invention.

What is claimed is:

1. A film depositing apparatus comprising:
 a process chamber;
 a gas supply source for supplying gases necessary for film deposition into the process chamber;
 an evacuating means for evacuating an interior of the process chamber;
 a target holder provided in the process chamber for holding a target;
 a substrate holder for supporting a deposition substrate such that the deposition substrate faces the target holder in the process chamber;
 a power supply for supplying electric power between the target holder and the substrate holder to generate plasma in the process chamber; and
 an anode provided between the target holder and the substrate holder so as to surround an outer periphery of a side of the substrate holder that faces the target holder for capturing ions and/or electrons in the plasma being generated within the process chamber,
 wherein the anode includes:
 a cylindrical member provided so as to surround the outer periphery of the side of the substrate holder that faces the target holder; and
 at least one annular plate member attached to an inside wall of the cylindrical member, the plate member having a central opening larger than a surface of the deposition substrate.

2. The apparatus according to claim 1, wherein the cylindrical member is in a circular cylindrical shape, and the plate member is in a circular-ring shape.

3. The apparatus according to claim 1, wherein the anode comprises two or more plate members that are provided in such a manner that they are superposed while being spaced apart from one another in a direction perpendicular to the side of the substrate holder that faces the target holder.

4. The apparatus according to claim 3, wherein the plate members are formed integrally with the cylindrical member such that the central openings of the plate members are coaxially located.

5. The apparatus according to claim 3, wherein the plate member that is located closer to the substrate holder has a shorter shortest distance from a center of the central opening to the inner surface.

6. The apparatus according to claim 3, wherein adjacent ones of the plate members are spaced apart by a distance of 1.0 mm to 15.0 mm.

7. The apparatus according to claim 1, wherein the anode is electrically grounded.

8. A piezoelectric film formed by means of the film depositing apparatus according to claim 1.

9. A film depositing method comprising the steps of:
 placing a target to be held by a target holder in a process chamber;
 providing a deposition substrate held by a substrate holder so as to face the target holder in the process chamber;
 generating plasma by supplying electric power between the target holder and the substrate holder while supplying gases necessary for film deposition into the process chamber; and
 depositing a film of a material of the target onto a surface of the deposition substrate as an anode captures ions and/or electrons generated in the plasma, the anode comprising: a cylindrical member that is provided between the target holder and the substrate holder so as to surround an outer periphery of the surface of the deposition substrate on which a film is deposited; and at least one annular plate member that is attached to an inside wall of the cylindrical member and that has a central opening larger than the deposition substrate.

10. The method according to claim 9, wherein the cylindrical member is in a circular cylindrical shape, and the plate member is in a circular-ring shape.

11. The method according to claim 9, wherein the anode comprises two or more plate members that are superposed so as to be spaced apart from one another in a direction perpendicular to a side of the substrate holder that faces the target holder.

12. The method according to claim 11, wherein the plate members are formed integrally with the cylindrical member such that the central openings of the plate members are coaxially located.

13. The apparatus according to claim 11, wherein the plate member that is located closer to the substrate holder has a shorter shortest distance from a center of the central opening to the inner surface.

14. The method according to claim 11, wherein adjacent ones of the plate members are spaced apart by a distance of 1.0 mm to 15.0 mm.

15. The method according to claim 9, wherein the anode is electrically grounded.

16. The method according to claim 9, wherein the material of the target is one of an insulator, a piezoelectric material, a dielectric material, and a ferroelectric material.

17. A piezoelectric film formed by the film depositing method according to claim 9.

18. The piezoelectric film according to claim 17, which has a surface roughness less than 50 Å above a surface roughness of the deposition substrate.

19. A liquid ejecting apparatus comprising:
  a piezoelectric device including the piezoelectric film according to claim 17 and electrodes provided on both surfaces of the piezoelectric film;
  a liquid reservoir for storing liquid, the liquid reservoir having a nozzle; and
  a diaphragm that is provided between the piezoelectric device and the liquid reservoir so as to transmit vibration from the piezoelectric device to the liquid reservoir,
    wherein the piezoelectric device is applied with a voltage to transmit vibration from the piezoelectric device to the liquid reservoir via the diaphragm, thereby ejecting the liquid in the liquid reservoir through the nozzle.

* * * * *